United States Patent [19]

Chen

[11] Patent Number: 5,611,448

[45] Date of Patent: Mar. 18, 1997

[54] WAFER CONTAINER

[75] Inventor: Fu-Liang Chen, Hsinchu Hsien, Taiwan

[73] Assignee: United Microelectronics Corporation, Hsinchu, Taiwan

[21] Appl. No.: 533,661

[22] Filed: Sep. 25, 1995

[51] Int. Cl.⁶ .................................................. B65D 85/00
[52] U.S. Cl. ......................................... 220/4.27; 206/445
[58] Field of Search ................................. 220/4.27, 4.21, 220/4.24; 206/385, 444, 445, 449

[56] References Cited

U.S. PATENT DOCUMENTS

| | | | |
|---|---|---|---|
| 3,369,691 | 2/1968 | Wei | 220/4.27 |
| 4,253,571 | 3/1981 | Keohan | 206/445 X |
| 4,787,508 | 11/1988 | Wu et al. | 206/445 |
| 5,363,977 | 11/1994 | Hoff | 220/4.27 |
| 5,454,468 | 10/1995 | Chou et al. | 206/445 X |

*Primary Examiner*—Steven M. Pollard
*Attorney, Agent, or Firm*—Cushman Darby & Cushman, IP Group of Pillsbury Madison & Sutro, LLP

[57] ABSTRACT

An integrated circuit wafer protective container for containing IC wafers during the process of IC wafer fabrication is disclosed. The protective container comprises a wafer-containing member and a wafer-protecting and securing member. The wafer-containing member is of a substantially cylindrical shape of a tube having a closed end and an open end. The inner diameter of the wafer-containing member is suitable for containing the IC wafers. The wafer-protecting and securing member is of a substantially cylindrical shape of a tube having a closed end and open end. The inner diameter of the wafer-protecting and securing member is suitable for receiving the cylindrical body of the wafer-containing member. The wafer-protecting and securing member has a number of latching protrusions formed at its open end on the inner side wall of its cylindrical shaped tube. The wafer-containing member has a number of latching slots formed at its closed end on the exterior surface of its cylindrical shaped tube. Each of the latching protrusions mates with a corresponding one of latching slots when the cylindrical body of the wafer-containing member is fully received inside the wafer-protecting and securing member. A wafer confinement member secures a stack of IC wafers stored in the wafer containing member.

17 Claims, 4 Drawing Sheets

WAFER CONTAINER

BACKGROUND OF THE INVENTION

1. Field of the Invention

The present invention relates in general to a container for protectively containing semiconductor integrated circuit wafers. In particular, the present invention relates to a container for securely and protectively containing a number of semiconductor integrated circuit wafers that is easy to access and handle.

2. Description of Related Art

Wafer containers are utilized to hold the IC wafers in the process of IC device fabrication. C. J. Wu et al. disclosed an IC wafer container in U. S. Pat. No. 4,787,508, the subject matter of which is hereby incorporated by reference as if fully set forth herein. The Wu et al container comprises a body member and its corresponding enclosure member.

FIG. 1 (Prior Art) of the accompanying drawings is a perspective view of a conventional IC wafer container including a body member and an enclosure member. As shown in the drawing, it is opened for insertion or removal of IC wafers. This known IC wafer container 1 has a body member 10 for containing the wafers and an enclosure member 20 for covering the body member 20 when required. When enclosure member 20 is fitted over body member 10, the container is a substantially cylindrical shape. Body member 10 and enclosure member 20 are threaded so that they can be secured to one another.

To store the wafers in the container, the covering enclosure member 20 must be removed from the body member 10, revealing an open end 120 for inserting or removing IC wafers, not shown in the drawing. During normal use of container 1, the body member 10 must be placed in the upright position with its closed end 110 below and its open end 120 above. IC wafers having a diameter compatible with the inner diameter of the body member 10 may be stored inside by successively stacking one wafer after another from the bottom up.

A number of longitudinal openings 130, for example, four in this referenced prior art example, are cut in the sidewall of the body member 10 parallel to the longitudinal axis thereof. This allows for the easy handling of the wafers when inserting them or removing them from the container. The edge of a wafer may be held when it is inserted or removed.

A helical screw threading 140 is formed near the closed end 110 of the body member 10 that is capable of threadingly engaging with the corresponding screw threading, not shown, and formed on the internal sidewall of the enclosure member 20 near the open end 220 thereof. The corresponding threading of both the body and enclosure members allows them to be secured to one another.

The enclosure member 20 has the basic structural configuration of a cylindrical cover sealed at the closed end 210 and opened at the open end 220. The open end 220 allows the enclosure member 20 to receive the open end 120 of the body member 10. On the top surface of the enclosure member 20, an annular indentation 230 is formed that in turn forms the circular protuberance 240 that allows for the grip of the fingers of a user when the enclosure member 20 is to be threaded in or out of engagement with the body member 10, or when it is to be lowered toward or raised from the body member 10. A ring-shaped surface 250 is formed on the closed end 210 of the enclosure member 20, which results in a short section of the cylindrical body with reduced diameter.

However, the prior art IC wafer container suffers from several disadvantages. First, the diameter of the circular protuberance 240 and the width of the annular indentation 230 on the top surface of the closed end 210 of the enclosure member 20 are essential for the smooth handling of its installation on and detachment from the body member 10. The width of the annular indentation 230 must be sufficient for the finger tips of a user to enter, while, on the other hand, the diameter of the circular protuberance 240 must be sufficiently large to reduce the rotational force that must be provided by the user in order to create sufficient torque to turn the enclosure member 20 relative to body member 10 when closing or opening the container. In the prior art arrangement, it is impossible to enlarge both the diameter and width of the circular protuberance 240 and the annular indentation 230.

Moreover, the threaded arrangement of this prior art IC wafer container requires that the user make multiple rotations of the enclosure member 20 against the body member 10 to close or open the container. This is rather inconvenient.

Furthermore, unless the entire wafer storage room within the container is filled with wafers, the container should never be tilted, either with or without the covering enclosure member 20 installed in place. Soft padding material must be inserted in the empty space above the stack of stored wafers inside the body member 10, in the case of partial containment of the container. Without this padding, the contained wafers may be damaged when the container is moved.

SUMMARY OF THE INVENTION

It iS therefore an object of the present invention to provide an IC wafer protective container that is easy to open and close.

It is another object of the present invention to provide an IC wafer protective container that will protect ICs stored therein even when the container is not filled, when the container is moved or roughly handled.

The present invention achieves the above-identified objects by providing an integrated circuit wafer protective container for containing IC wafers during the process of IC wafer fabrication. The protective container comprises essentially three parts: a wafer-containing member, a wafer-protecting and securing member, and a wafer confinement member.

The wafer-containing member of substantially cylindrical shape having a substantially circular closed end, and a plurality of sidewall sections. The sidewall can be formed separately or by cutting longitudinal slots in a tube-like member. The sidewall sections together form a substantially cylindrical shape having an open end opposite to the closed end and having a diameter suitable for containing the IC wafers. Each sidewall section has a plurality of notches therein for receiving a portion of the wafer confinement member. The closed end has a plurality of latching slots formed in an exterior surface thereof.

The wafer-protecting and securing member is a substantially cylindrical shape tube having a closed end and open end. The inner diameter of the wafer protecting and securing member is suitable for receiving the cylindrical body of the wafer-containing member. A number of latching protrusions are formed at its open end on the inner side wall of its cylindrical shaped tube. Each of the latching protrusions mates with a corresponding one of latching slots when the cylindrical body of the wafer containing member is fully received inside the wafer-protecting and securing member.

The wafer-confinement member is formed as a substantially flat plate having a plurality spokes extending outwardly from the center thereof in a substantially symmetrical arrangement. Each spoke has a securing slot formed in a side thereof for mating with a notch formed in a sidewall section of the wafer-containing member. In use, the wafer confinement member can be positioned on top of the uppermost IC wafer stored in the container. This eliminates the need for soft packing material needed in the prior art arrangement. The wafer confinement member prevents the IC wafers from moving during rough handling of the container.

BRIEF DESCRIPTION OF THE DRAWING

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
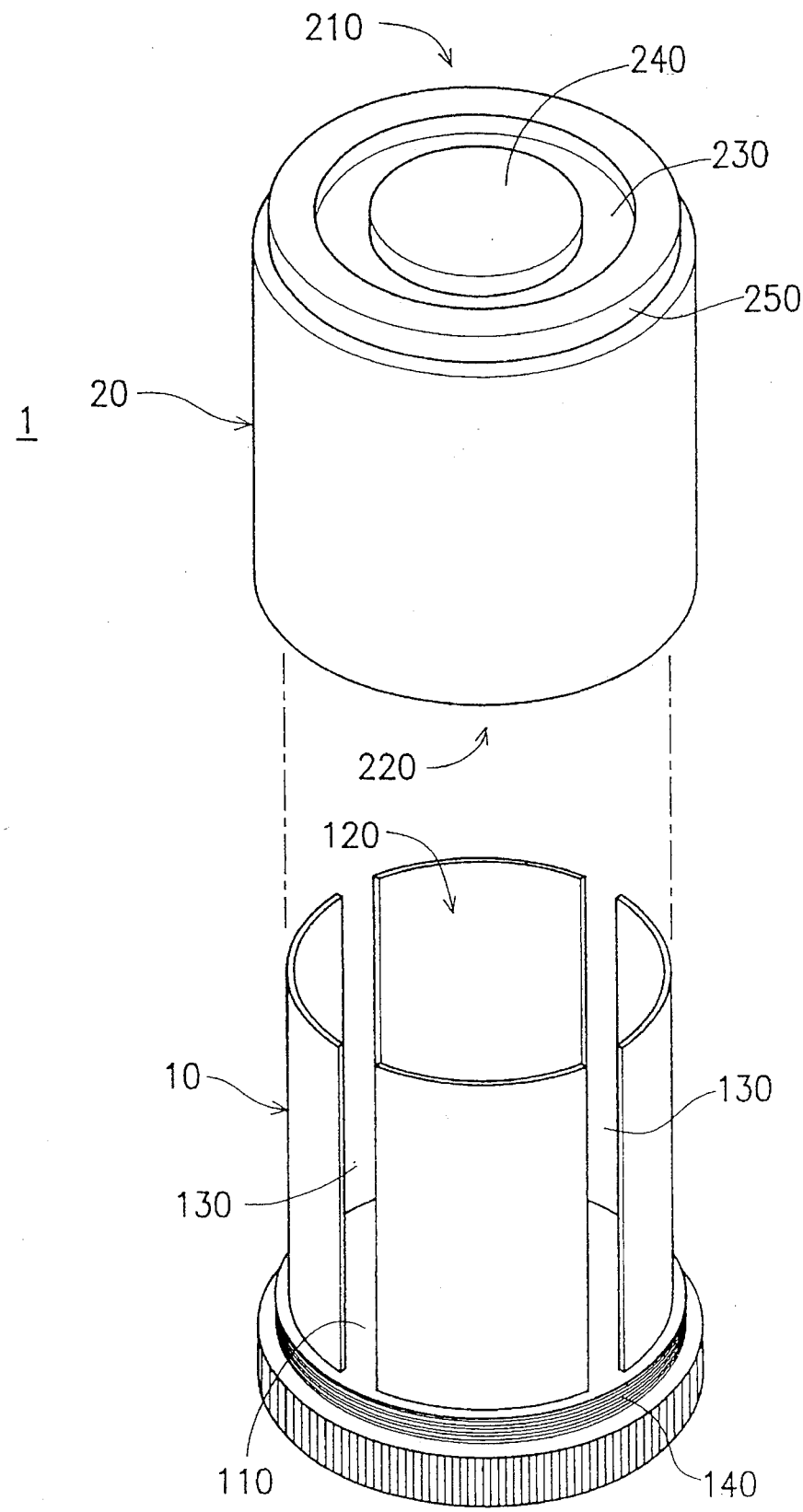
FIG. 1 (Prior Art) is a perspective view of a conventional IC wafer container, showing the constituting body member and the enclosure member in the opened status.
Figure 2:
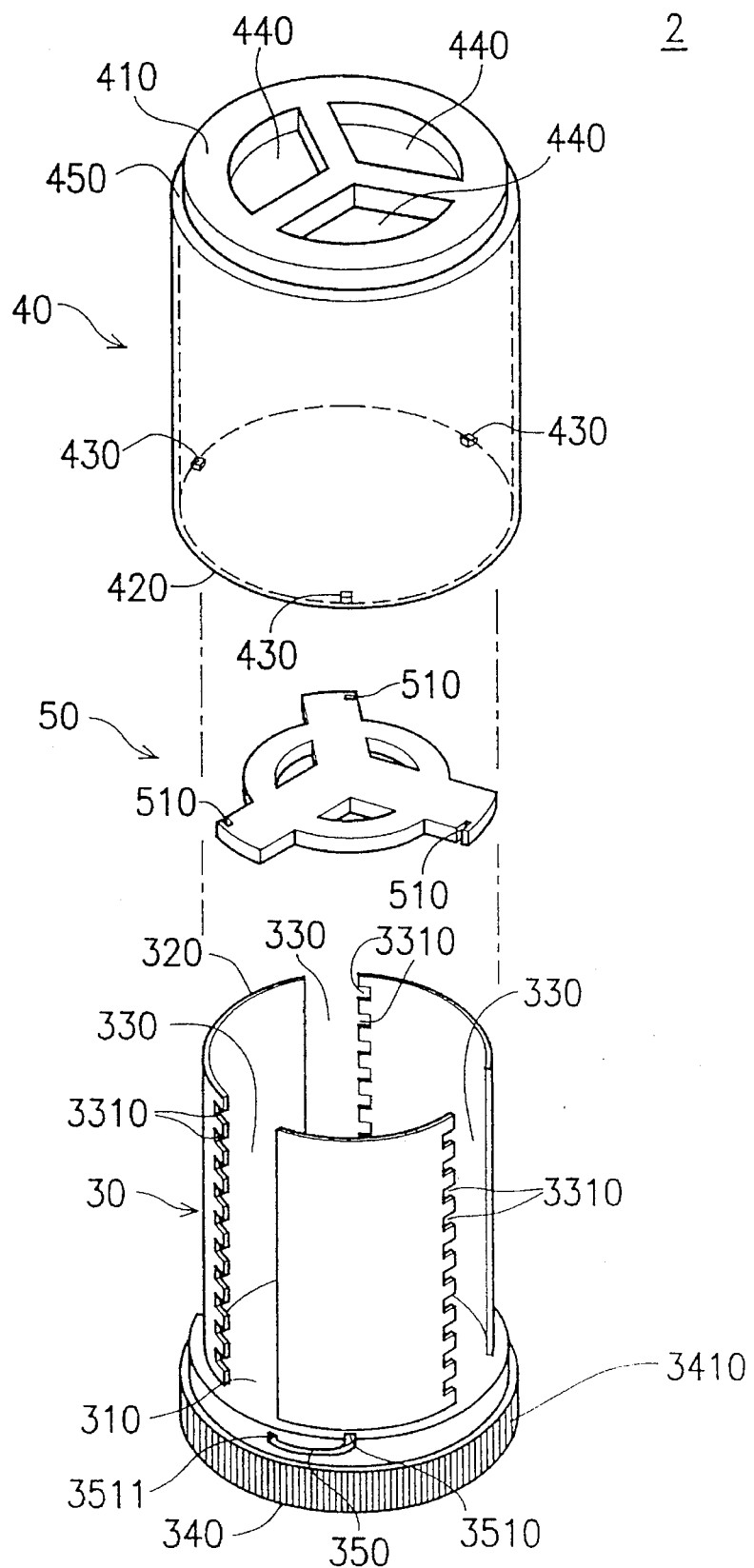
FIG. 2 is an exploded view of the IC wafer protective container in accordance with a preferred embodiment of the present invention, showing the wafer-containing member, wafer-protecting and securing member, and wafer-confinement member.

FIG. 2 is an exploded view of the IC wafer protective container in accordance with a preferred embodiment of the present invention, showing the wafer-containing member, wafer-protecting and securing member, and wafer-confinement member. Container 2 includes essentially three separate and distinct parts: a wafer-containing member 30, a wafer-protecting and securing member 40, and a wafer-confinement member 50. The protective container 2 of the present invention is suitable for holding a stacked pile of IC wafers (such as wafers 60 seen in FIG. 3).

Wafer-containing member 30 is basically a cylindrical-shaped tube structure, although polygonal cylinders such as quadrangular, pentagonal, hexagonal, or octagonal cylinders are also feasible. The wafer-containing member 30 has an open end 320 that provides an entrance for receiving IC wafers to be contained. Opposite to the open end 320 of the wafer containing member 30 is the closed end 310 that constitutes the base for the placement of the contained IC wafers. Along the cylindrical side wall of the wafer containing member 30, a number of longitudinal openings 330 are formed to be parallel to the longitudinal axis of the cylindrical body thereof. Three of the longitudinal openings 330 are shown to be formed in the described embodiment of the present invention, although a greater or lesser number of openings, for example, four or two, may also be feasible.

These longitudinal openings 330 allow for the easy and smooth handling of the wafers during the process of either storing or retrieving from inside the wafer-containing member 30, as the edge of a wafer may be held when it is lowered or raised inside the cylindrical space. At the remotest end of the closed end 310 of the wafer-containing member 30, a stacking edge 340 forms a hollow space that allows for the stacking on top of another IC wafer protective container in a way to be described below. The exterior surface of this stacking edge 340 is carved with a grip carving 3410 to assist in the firm handling of the container when the wafer-containing member 30 and the wafer-protecting and securing member 40 are being joined or detached.

Latching slots 350 are formed in the cylindrical surface of the body of the wafer containing member 30 at the closed end 310. There should be at least two such latching slots. These are narrow slots recessed into the exterior surface of the short section of cylindrical body that has a smaller diameter than the short cylindrical section featuring the grip carving 3410. There are three of the latching slots 350 in the embodiment depicted in the drawing. Each of the slots 350 has a slot entrance 3510 that allows for the entrance of a corresponding latching protrusion 430 formed on the wafer-protecting and securing member 40 to be described later. These latching slot and protrusion combinations provide for the secured latching of the wafer-protecting and securing member 40 to the wafer-containing member 30 when IC wafers are temporarily contained in the container 2 in their process of fabrication. The latching slots and protrusions constitute a means for latching the wafer protecting and securing member with the wafer containing member. However, it is possible to arrange other means for latching these two members. For example, the protrusions and slots could be interchanged on the two members. Other types of connectors could also be used. In any case, the connector arrangement chosen should be easy to use and not require repeated turns such as with the threading arrangement of the prior art.

The wafer-protecting and securing member 40 is also basically a cylindrical shaped tube structure, although polygonal cylinders such as pentagonal and hexagonal cylinders corresponding to the configuration of the wafer containing member 30 are also feasible. The wafer-protecting and securing member 40 also has an open end 420 that is the entrance for receiving the entire column of the wafer-containing member 30. Opposite to the open end 420 of the wafer-protecting and securing member 40 is the closed end 410 that constitutes the roof cover for the entire IC wafer protective container 2 when the two members 30 and 40 are joined.

Latching protrusions 430 are formed at the open end 420 of the wafer-protecting and securing member 40 on the inner surface thereof. Each of these latching protrusions 430 may mate with a corresponding latching slot 350 of the wafer-containing member 30 by inserting the entire protrusion 430 into the latching slot 350 via the latching slot entrance 3510. Once all three latching protrusion 430 of the wafer-protecting and securing member 40 are received in their corresponding latching slots 350 of the wafer-containing member 30, the member 40 can be turned about its center symmetrical axis with respect to the member 30 for an angle that is a fraction of one complete 360-degree rotation. This small angle rotation is sufficient to secure the wafer-protecting and securing member 40 firmly to the wafer-containing member 30. The configuration of the latching slot 350 at the closed end 310 of the wafer-containing member 30 brings the wafer-protecting and securing member 40 slightly toward the closed end of member 30 before getting into a latching notch 3511 at the end of the slot 3510 that is slightly raised upward. Entrance of the latching protrusions 430 into the corresponding latching notches 3511 results in the secure combination of the two members 30 and 40.

Over the top surface of the wafer-protecting and securing member 40, are formed a number of handling recessions 440. These handling recessions 440 may be formed by, for example, fabricating a three-spoke configuration on the top surface of member 40. Installation and detachment of the wafer-containing member 30 and the wafer-protecting and securing member 40 may be facilitated by securing the member 30 and turning the member 40 in the correct direction by gripping to these handling recessions 440.

The handling recessions 440 also serve as the securing protrusions that secures the very top IC wafer piled up inside the wafer-containing member 30 when the latching protrusions 430 and the latching notches 3511 are correctly mated together. A ring-shaped surface 450 is also formed over the top surface of the wafer-protecting and securing member 40 by reducing the diameter of the cylindrical body of the member 40 for a short length. This ring-shaped surface 450, as well as the short reduced-diameter cylindrical section may be inserted into the hollow cylindrical space within the confinement of the stacking edge 340 of the wafer-containing member 30, when the entire IC wafer protective container 2 is stacked on top of another container. A number of containers 2 may be stacked for temporarily storing the IC wafers in high piles during the process of IC wafer processing.

The wafer-confinement member 50, when put in place, securely confines IC wafers that have been placed into container 2, even if the number of IC wafers so placed does not fill the container. In the exemplified embodiment of the present invention, the wafer-confinement member 50 is a three-spoke plate having one securing slot 510 formed near the tip of each of the spokes at one side as is shown in FIG. 2. Each of the securing slots 510 serves to mate with the bottom of the corresponding securing notch 3310 formed on the one side of each of the longitudinal openings 330. The distance between the consecutive securing notches may be equivalent to the thickness of the IC wafers to be contained inside the container of the present invention.

Figure 3:
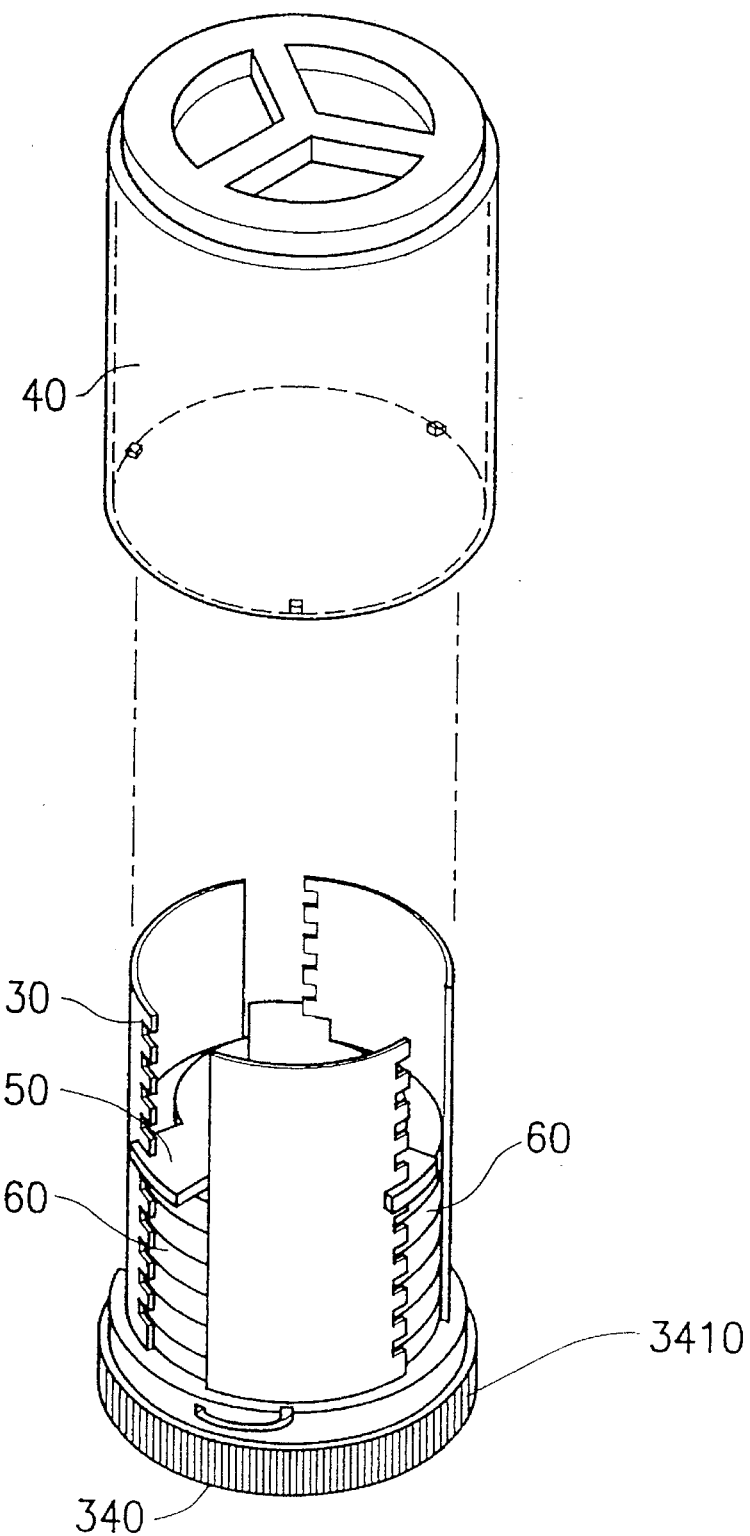
FIG. 3 is an exploded view of the IC wafer-protective container of FIG. 2 showing the partial load of IC wafers therein.

FIG. 3 is an exploded view of the IC wafer-protective container of FIG. 2 showing the partial load of IC wafers therein. The wafer-confinement member 50 can be mated at the proper height of the side wall of the wafer-containing member 30 that matches the piled height of the stack of stored wafers 60. With the installation of the wafer-confinement member 50 at the proper height, all the IC wafers 60 inside the partially loaded wafer-containing member 30 of a container 2 may still be secured without the insertion of soft padding material as was necessary in the prior art container described above. This allows for the more convenient handling of the containers 2 regardless of whether or not the containers are fully loaded.

Figure 4:
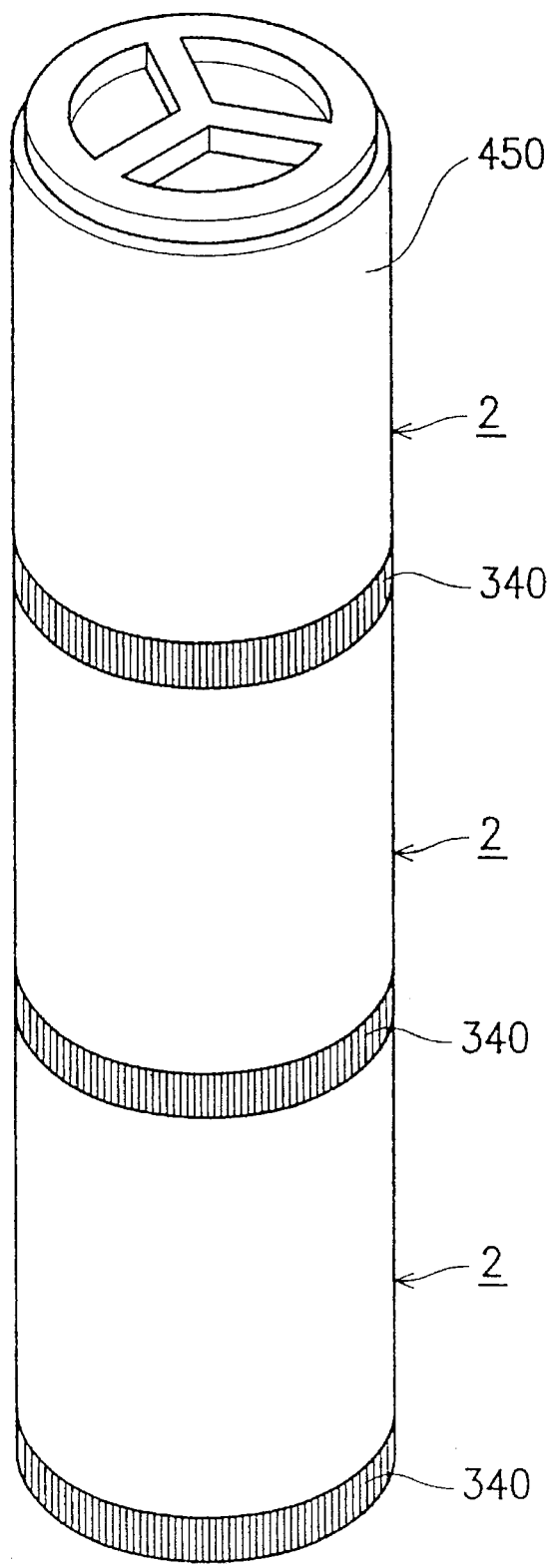
FIG. 4 is a perspective view showing the stacking of three of the IC wafer-protective containers of FIG. 2.

FIG. 4 is a perspective view showing the stacking of three of the IC wafer-protective containers of FIG. 2. The structural configuration characteristics of the IC wafer protective container 2 allows for the stacking of a number of containers for ease of both handling and storage. The containers can be tilted during handling and transporting, even if they are only partially loaded. The closing and opening of the cover, that is, the wafer protecting and securing member 40 is also convenient, as only a fraction of a 360-degree rotation is sufficient to facilitate opening and closing.

Although the present invention has been described in considerable detail with reference to certain preferred embodiments thereof, other versions are possible. Therefore, the spirit and scope of the appended claims should not be limited to the description of the preferred versions contained herein.

What is claimed is:

1. A wafer container for containing IC wafers comprising:

a wafer-containing member of substantially cylindrical shape having a sidewall, a closed end and an open end, the sidewall having a diameter suitable for containing the IC wafers, said sidewall having at least two longitudinal slots formed therein parallel to a longitudinal axis of said wafer container, said at least two longitudinal slots each having a plurality of securing notches formed along a length thereof;

a wafer-protecting and securing member of a substantially cylindrical shape having a closed end and an open end and a diameter suitable for receiving the cylindrical body of the wafer containing member, said wafer-protecting and securing member and said wafer-containing member each having securing structure constructed and arranged to permit said wafer-protecting and securing member to be removably secured to said wafer-containing member when the cylindrical body of said wafer-containing member is received within said wafer-protecting and securing member; and a wafer-confinement member comprising a flat plat having radially extending spokes, each of said radially extending spokes having a securing slot formed in a side thereof and adapted to engage a selected one of said plurality of securing notches formed along one of said at least two longitudinal slots.

2. The wafer container as in claim 1, wherein the wafer-protecting and securing member is shaped so as to have at least two handling recesses formed in a top surface at the closed end thereof.

3. The wafer container as in claim 1, wherein the distance between consecutive securing notches is substantially equal to the thickness of wafers to be stored in the container.

4. The wafer container as in claim 1, wherein the wafer-containing member has 2–4 longitudinal slots.

5. A wafer container for containing IC wafers comprising:

a wafer-containing member of substantially cylindrical shape having a substantially circular closed end, and a plurality of sidewall sections, the sidewall sections together forming a substantially cylindrical shape having an open end opposite to the closed end and having a diameter suitable for containing the IC wafers, the sidewall sections being positioned about the closed end such that there are longitudinal spaces therebetween, each sidewall section having a plurality of notches therein;

a wafer-protecting and securing member of a substantially cylindrical shape having a closed end and open end and a diameter suitable for receiving the cylindrical body of the wafer containing member;

means for latching the wafer containing member with the wafer protecting and securing member; and a wafer-confinement member formed as a substantially flat plate having a plurality spokes extending outwardly from the center thereof in a substantially symmetrical arrangement, each spoke having a securing slot formed in a side thereof for mating with a notch formed in a sidewall section of the wafer-containing member.

6. The wafer container as in claim 5, wherein the latching means comprises:

a plurality of latching slots formed in an exterior surface of the wafer containing member; and a plurality of latching protrusions formed on an inner sidewall of the wafer-protecting and securing member at the open end, the latching protrusions and latching slots being positioned so that each latching protrusion mates with a corresponding latching slot when the cylindrical body of the wafer-containing member is fully received inside the wafer-protecting and securing member.

7. The wafer container as in claim 6, wherein each of the latching slots of the wafer-containing member has a length that is a fraction of the circumference thereof and extends from a latching slot opening generally downward toward the closed end of the wafer-containing member and is raised toward the open end of the wafer-containing member at the end of the length thereof.

8. The wafer container as in claim 5, wherein the wafer-protecting and securing member is shaped so as to have least two handling recessions formed in a top surface at the closed end thereof.

9. The wafer container as in claim 8, wherein the wafer-containing member has three or four latching slots and the wafer-protecting and securing member has a corresponding number of latching protrusions.

10. The wafer container as in claim 5, wherein the wafer-containing member has 2–4 sidewall sections.

11. The wafer container as in claim 5, wherein the distance between consecutive notches formed in sidewall sections is substantially equal to the thickness of wafers to be stored in the container.

12. The wafer container of claim 1 wherein said securing structure comprises a plurality of latching slots formed on a one of an exterior surface of said wafer-containing member and an interior surface of said wafer-protecting and securing member and a plurality of latching protrusions formed on the other of said exterior surface of said wafer-containing member and said interior surface of said wafer-protecting and securing member, a portion of each of said latching slots extending substantially circumferentially about only a portion of an entire periphery of said one of said exterior surface of said wafer-containing member and said interior surface of said wafer-protecting and securing member, said latching protrusions and said latching slots being positioned to enable each of said plurality of latching protrusions to mate with a corresponding latching slot when the cylindrical body of said wafer-containing member is fully received inside said wafer-protecting and securing member, each latching protrusion being received into said corresponding latching slot at a latching slot entrance of said corresponding latching slot, said wafer-protecting and securing member being secured to said wafer-containing member by rotating said wafer-protecting and securing member less than an entire revolution with respect to said wafer-containing member to move each latching protrusion within said corresponding latching slot from said latching slot entrance of said corresponding latching slot to an opposite end of said corresponding latching slot.

13. The wafer container as in claim 12, wherein each of the latching slots of the wafer-containing member has a length that is a fraction of the circumference thereof and extends from a latching slot opening generally downward toward the closed end of the wafer-containing member and is raised toward the open end of the wafer-containing member at the end of the length thereof.

14. The wafer container of claim 12, said plurality of latching slots being formed on said exterior surface of said wafer-containing member and said plurality of latching protrusions being formed said interior surface of said wafer-protecting and securing member.

15. The wafer container as in claim 14, wherein the wafer-containing member has three or four latching slots and the wafer-protecting and securing member has a corresponding number of latching protrusions.

16. The wafer container of claim 12 wherein said latching slots comprise, extending from said latching slot entrance, a first section extending substantially axially downwardly, a second section extending from said first section substantially circumferentially about only a portion of the entire periphery of said wafer-containing member, and a locking notch extending from said second section substantially axially upwardly and terminating at said opposite end.

17. The wafer container of claim 1 wherein said wafer-confinement member has a radially extending spoke corresponding to each of said at least two longitudinal slots.

\* \* \* \* \*